United States Patent [19]

Miljanic et al.

[11] Patent Number: 4,841,236
[45] Date of Patent: Jun. 20, 1989

[54] CURRENT RATIO DEVICE

[75] Inventors: Petar N. Miljanic, Gloucester; William J. M. Moore, Ottawa, both of Canada

[73] Assignee: Canadian Patents and Development Limited-Societe Canadienne Des Brevets Et D'Exploitation Limitee, Ottawa, Canada

[21] Appl. No.: 171,765

[22] Filed: Mar. 22, 1988

[51] Int. Cl.$^4$ .............................................. G01R 1/20
[52] U.S. Cl. ..................................... 324/127; 324/55; 324/117 R; 330/293
[58] Field of Search ................. 324/55, 117 R, 117 H, 324/115, 127, 60 C; 307/512, 350; 328/162, 165, 166; 330/293

[56] References Cited

U.S. PATENT DOCUMENTS

| | | | |
|---|---|---|---|
| 3,153,758 | 10/1964 | Kusters | 324/55 |
| 3,534,247 | 10/1970 | Miljanic | 324/55 |
| 4,255,704 | 3/1981 | Milkovic | 324/127 |
| 4,424,480 | 1/1984 | Stefan | 324/60 C |
| 4,554,513 | 11/1985 | So | 330/295 |
| 4,616,174 | 10/1986 | Jorgensen | 324/117 R |

OTHER PUBLICATIONS

"The Zero-Flux Current Transformer"-A. Hobson-AIEE Transactions-Aug. 1953-pp. 608-615.
"A Circuit For Reducing The Exciting Current Of Inductive Devices" by D. L. H. Gibbings-The Institution of Electrical Engineers May 1981-pp. 339-342.

Primary Examiner—Michael J. Tokar

[57] ABSTRACT

A current ratio device for use in constructing a current transformer comprises a first magnetic core, a second magnetic core, a measuring winding electromagnetically coupled with the first core but not with the second core, and a compensating winding electromagnetically coupled with both cores. An externally powered amplifier has its input connected to receive the voltage waveform across the measuring winding. Its output provides a compensating current through the compensating winding equal to a magnetizing current required to magnetize the second core. The amplifier output also provides a measuring current through the measuring winding in the direction opposite that of the compensating current and equal to the compensating current multiplied by the ratio of turns in the compensating and measuring windings. This device is a self-contained article of commerce that, when electromagnetically coupled (without electrical connection) to conventional primary and secondary windings and a burden, provides a current transformer with improved qualities. In particular, the magnetizing current needed by the transformer is provided by the separate current ratio device, thus avoiding the error inherent in current transformers that arises from the need to supply the magnetizing current from the primary circuit. Another disclosed feature is the ability to examine the waveform of the magnetizing current and in particular to detect the presence of even harmonics and hence a probability of direct current in the primary circuit.

21 Claims, 4 Drawing Sheets 4,841,236

CURRENT RATIO DEVICE

FIELD OF THE INVENTION

This invention relates to a current ratio device, and more particularly to a current ratio device that can be used to construct an improved alternating current current transformer.

BACKGROUND OF THE INVENTION

Current transformers provide a means for transforming very large currents by a known ratio to lower current values that can be easily measured or applied to electric instrumentation. To accomplish this, however, a component of the input current is required to magnetize the magnetic core of the transformer and, as a result, the output current is deficient, or is in error, by an amount corresponding to this magnetizing current.

PRIOR ART

Examples of previous proposals for compensating for this error by means of so-called "electronically aided" current transformers are described in U.S. Pat. No. 3,534,247 issued Oct. 13, 1970 to P. N. Miljanic.

SUMMARY OF THE INVENTION

The object of the present invention is to afford further improvements in these prior proposals, while providing a current ratio device that, when used to construct a current transformer, affords the latter enhanced accuracy, stability and ease of use.

Another object of the invention is to provide means for examining the waveform of the magnetizing current, and, in particular, detecting the presence of even harmonics in the magnetizing current and hence the probable presence of direct current in the primary circuit of the transformer.

The various features of the invention will be apparent from the following specific description which is provided by way of example only.

DETAILED DESCRIPTION OF THE PREFERRED EMBODIMENTS

Figure 1:
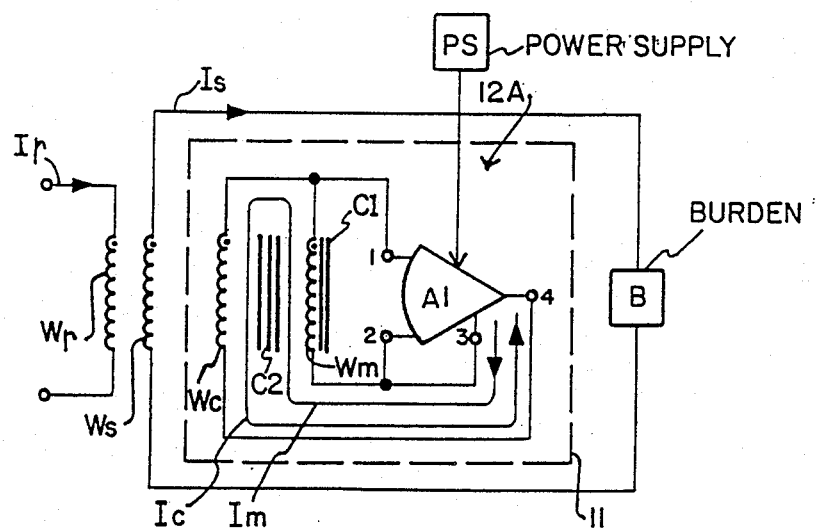
FIG. 1 shows a first circuit illustrating one aspect of the present invention.
Figure 3:
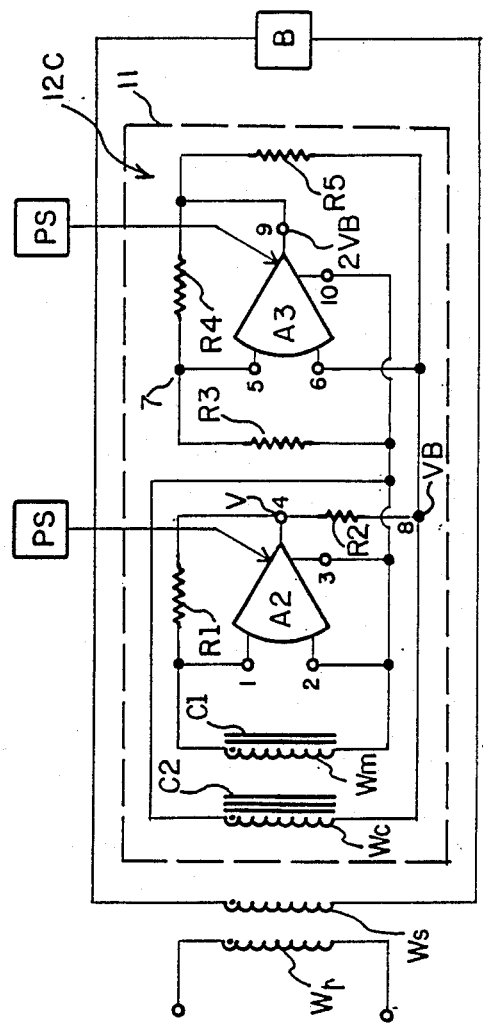
FIG. 3 shows an improved version of FIG. 2.
Figure 4:
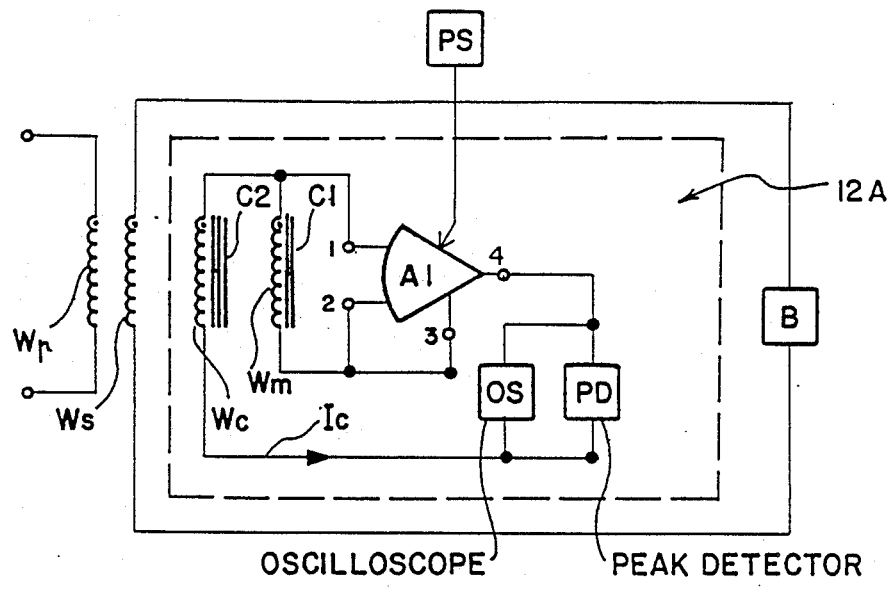
FIG. 4 shows another modification of FIG. 1 illustrating a second aspect of the invention.

The device shown in FIG. 1 is a current transformer with two cores C1 and C2. While these cores can be located side-by-side, as shown in FIG. 3 of the Miljanic patent referred to above, it is preferred to employ a configuration in which the core C2 is a hollow toroid that encloses and shields the core C1, as shown in FIG. 4 of such prior patent. Such a transformer is described in more detail in U.S. Pat. No. 3,153,758 issued Oct. 20, 1964 to N. L. Kusters et al.

The outer core C2 couples electromagnetically with three windings that are outside it, namely a primary winding Wp, a secondary winding Ws and an auxiliary or "compensating" winding Wc, but does not couple electromagnetically with a fourth, sensing or "measuring" winding Wm that is wound on the core C1 inside the core C2. The inner core C1 couples electromagnetically with all four windings. In the normal manner of a current transformer, an input or primary current Ip flows in the primary winding Wp, and an output or secondary current Is flows in the secondary winding Ws and a burden B.

Since a component of the input current Ip is required to magnetize the outer or second core C2, the secondary current Is is deficient by a corresponding amount, and the theoretical equality of ampere turns between the primary and secondary circuits contains an error, such error being expressed as the magnetizing current $I\mu$. The flux in the core C2 corresponding to this magnetizing current is sensed by the measuring winding Wm which acts with the inner or first core C1 to generate a current Im in the winding Wm that is equal to the magnetizing current $I\mu$.

The ends of the winding Wm are connected to input terminals 1, 2 of an inverting amplifier A1 so that such input receives the current in this measuring winding. The amplifier A1 has an external power supply PS and a gain that is such that no appreciable voltage is permitted to remain across the terminals 1, 2. The output terminals 3, 4 of the amplifier A1 form a series circuit through windings Wm and Wc so that the current Im passing in one direction through the winding Wm is equal to the current Ic passing in the other direction through the winding Wc. Hence, in this case, the compensating current Ic equals the measuring current Im and becomes equal to the magnetizing current $I\mu$, thus supplying the necessary magnetizing current for the core C2. This arrangement eliminates the need for this magnetizing current to be supplied from the primary current Ip. As a result, the true equality of the ampere turns in the primary and secondary windings is not upset by the need to supply a magnetizing current.

It should be noted that this is a compensation circuit rather than a typical feedback circuit and is thus not subject to the problems, e.g. instability, to which feedback circuits are prone.

It should also be noted that the amplifier input terminals 1, 2 need not necessarily be connected directly across the measuring winding Wm. There could be an interposed transformer, as in the arrangement shown in FIG. 2 of the prior Miljanic patent referred to above. The important concern is that the amplifier input receives the measuring winding waveform.

The circuit of FIG. 1 requires the number of turns Nc in the compensating winding Wc to be equal to the number of turns Nm in the measuring winding Wm. If it is desired to avoid this requirement, the more general circuit of FIG. 2 can be used. Here, the input terminals 1, 2 of a similar amplifier A2 are again connected across the winding Wm, and a current Im flows in that winding from the amplifier output terminals 3, 4 and through a resistor R1. This results in a voltage V at the amplifier output terminal 4 equal to ImR1. The junction between terminals 2 and 3 is considered as ground. This voltage V acts through a second resistor R2 to inject into the compensating winding Wc a current Ic that magnetizes the core C2, i.e. provides the magnetization current $I\mu$ as before. The resistance ratio R1/R2 must be equal to the turns ratio Nm/Nc.

Figure 2:
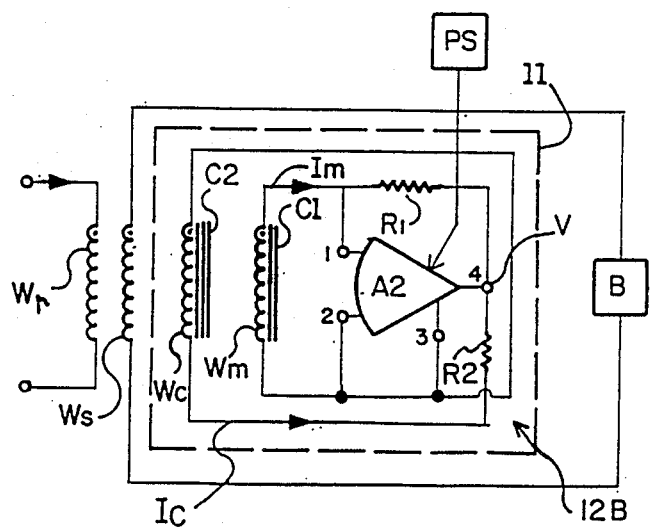
FIG. 2 shows a modification of FIG. 1.

FIG. 3 shows a modification of FIG. 2 that corrects for the influence of the impedance of the compensating winding Wc. The connections to the amplifier A2 are unchanged, but a further amplifier A3 is provided to act as a voltage doubler. This amplifier A3 receives its input at terminals 5, 6 connected between a center point 7 between a pair of series-connected resistors R3, R4 of equal value, and a junction point 8 between the compensating winding Wc and the resistor R2. This serves to generate a voltage 2VB across the output terminal 9, 10, where VB is the voltage at point 8. The current provided by the amplifier A2 and flowing through the winding Wc and the resistor R2 equals $$\frac{V - VB}{R2}.$$

Due to the second amplifier A3 there will now be an additional current that flows through the winding Wc and a further resistor R5 that is equal in value to the resistor R2. Such additional current will have the value $$\frac{2VB - VB}{R5}.$$

Since R5=R2, the total compensating current in the winding Wc becomes $$\frac{2VB - VB}{R2} + \frac{V - VB}{R2} = \frac{V}{R2},$$

i.e. a current that is independent of the voltage VB across the winding Wc, and thus independent of the impedance of such winding.

It is not essential that a ratio of 2:1 be used for this circuit. If, instead of being equal in value, the resistors R4, R3 have a predetermined ratio n to each other, then the resistors R2 and R5 must meet the requirement that $$n = \frac{R4}{R3} = \frac{R5}{R2}.$$

In FIGS. 2 and 3 the parts of the transformer outside the broken line 11 are the same as in FIG. 1. The line 11 serves to demonstrate the total electrical isolation of the parts outside this line, i.e. the primary and secondary windings Wp and Ws and the burden B (these being conventional elements of a current transformer in use) from the current ratio device 12A (FIG. 1), 12B (FIG. 2) or 12C (FIG. 3) enclosed within the line 11, the elements of such device being the cores C1, C2, windings Wm, Wc, and the electronic components, i.e. the amplifier (or amplifiers) with their associated elements such as resistors and power supplies. The coupling across the line 11 is solely electromagnetic. This feature distinguishes the present invention in an important manner from the circuits in the prior Miljanic patent referred to above, and has a valuable manufacturing advantage. In practice, the device 12A, B or C is a separate article of manufacture that can be enclosed in a toroidally shaped, copper box for transportation to a place of use where the primary and secondary windings will be installed, i.e. passed through the hole in the toroidal box, thus serving to assemble a complete current transformer. In other words, such separate, self-contained, current ratio device has the ability, when electromagnetically coupled with conventional primary and secondary current transformer windings, to render the resultant instrument essentially error-free as far as the magnetizing current is concerned.

Since this magnetizing current $I\mu(=Ic)$ is present in each of these current ratio devices as a separate, identifiable entity, it is possible to examine its waveform by means of an oscilloscope to provide data on the performance of the core C2. Also of particular importance is whether this waveform contains any even harmonics, as such harmonics could indicate the presence of a direct current component in the primary current Ip. Even harmonics can be detected by a known peak detector and FIG. 4 shows how such a peak detector PD can be inserted into the device 12A of FIG. 1 to pass the current Ic. It could be used in a like manner in the device of FIG. 2 or 3, in which case the peak detector could be arranged to pass either the measuring current Im or the compensating current Ic, since these are identical to each other in all respects other than amplitude. The oscilloscope OS will preferably be connected across the peak detector PD, although it could be located elsewhere in the circuit where the voltage waveform of the measuring and compensating currents is present.

Knowledge of the presence of even harmonic components in the magnetising current and hence the likely presence of a direct current component in the primary current is very valuable data in controlling power electronic circuits, e.g. controlling feedback to a rectifier or inverter, and the instrument of FIG. 4 can thus serve the dual functions of an A.C. current transformer and a D.C. current detector.

Figure 5:
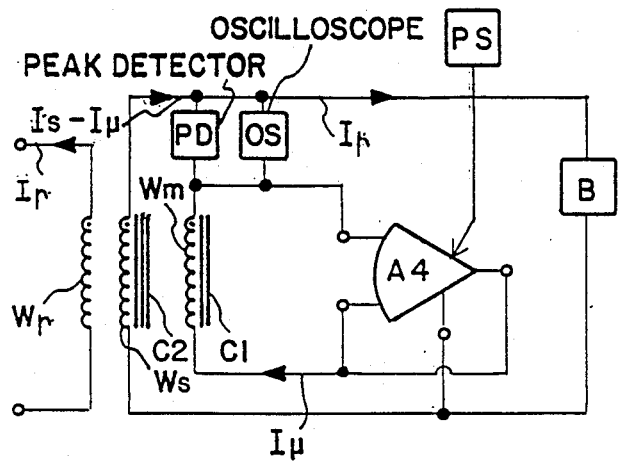
FIG. 5 shows another circuit embodying this second aspect.

As shown in FIG. 5, the invention also envisages the application of this latter feature, namely observing the waveform of the magnetizing current by an oscilloscocpe OS and/or sensing the presence of even harmonics therein by a peak detector PD, to a circuit that does not have the "electrical isolation" feature of FIGS. 1–4. FIG. 5 shows a modification of FIG. 1 in which no compensating winding is used, the output of an amplifier A4 passing a current equal to the magnetizing current $I\mu$ through a connection of the measuring winding Wm in parallel with the secondary winding Ws and in series with the burden B, whereby to make up this deficiency in the secondary current Is that passes through the secondary winding Ws. This winding arrangement is essentially the same as shown in FIG. 1 of the prior Miljanic patent referred to above, except that, in accordance with the present invention, either or both of the oscilloscope OS and the peak detector PD are now employed to monitor the magnetizing current in essentially the same manner as in FIG. 4.

Figure 6:
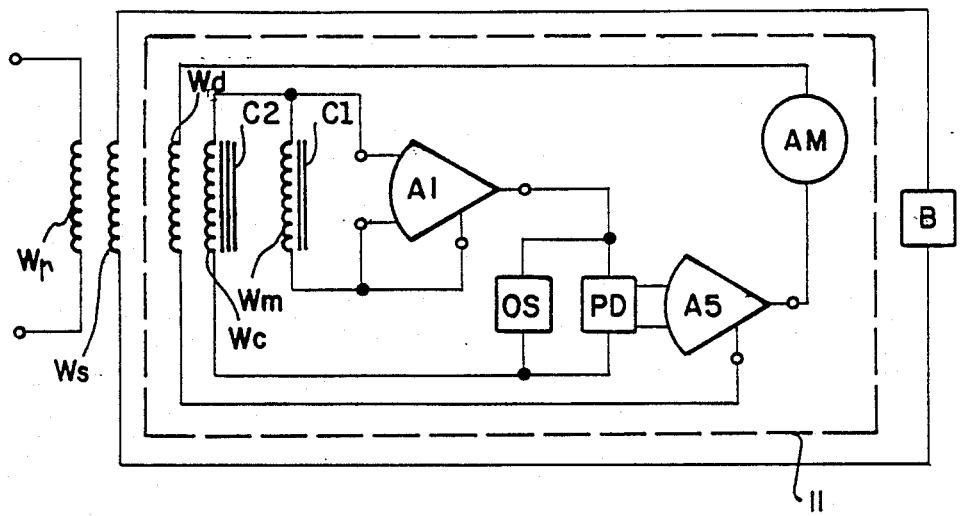
FIG. 6 shows a modification of FIG. 4.

FIG. 6 shows a modification to FIG. 4 in which, not only are even harmonics detected by the peak detector PD, but any direct current that is present is measured. For this purpose the output from the peak detector PD is connected to the input of a D.C. amplifier A5, the output of which is connected to a D.C. feedback circuit consisting of a series connection of an ammeter AM and an addition winding Wd which constitutes a D.C. feedback winding electromagnetically coupled with both the cores. This arrangement will bring the output of the detector PD to zero by compensating in the current ratio device for the D.C. component in the primary winding, the value of such D.C. component then being displayed by the ammeter AM.

Figure 7:
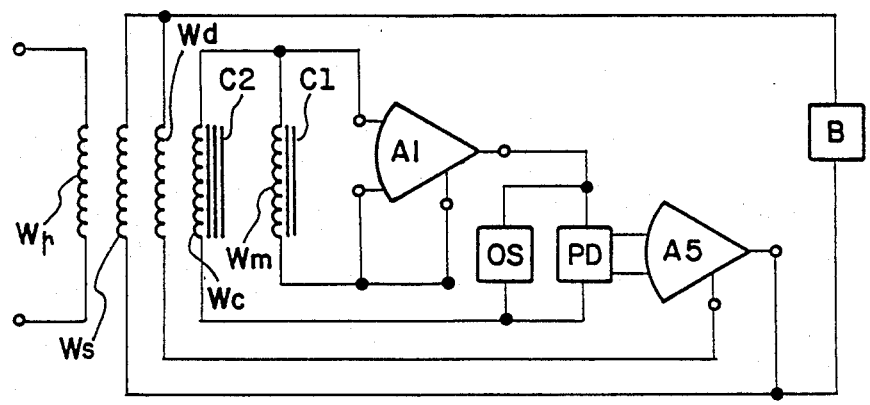
FIG. 7 shows a still further modification.

FIG. 7 shows a still further modification in which the output of the amplifier A5 is connected to a series circuit of the winding Wd and the burden B, whereby the D.C. component is injected into the current flowing in the burden, thus causing this current to be a replica of the primary current in respect of its D.C. component as well as its A.C. component.

The feature of D.C. component measurement of the circuit of FIG. 6 and the replica feature of the circuit of FIG. 7 can be applied to any one of the circuits of FIGS. 1-5.

We claim:

1. A device for use in constructing an alternating current, current transformer, said device comprising
   (a) a first magnetic core,
   (b) a second magnetic core,
   (c) a measuring winding having Nm turns electromagnetically coupled with the first core but not with the second core,
   (d) a compensating winding having Nc turns electromagnetically coupled with both cores,
   (e) an amplifier having an input and an output,
   (f) said input being connected to receive the waveform across the measuring winding,
   (g) said output being connected to the compensating winding to provide a compensating currect Ic through the conpensating winding equal to a magnetizing current I$\mu$ required to magnetize the second core, and
   (h) said output being connected to the measuring winding to provide a measuring current Im through the measuring winding in a direction opposite to that of the compensating current and equal to $$\frac{IcNc}{Nm},$$

whereby, when primary and secondary windings are electromagnetically coupled with the cores to form an alternating current, current transformer and the secondary winding is connected to a burden, the magnetizing current I$\mu$ for such transformer is provided by the device.

2. A device as in claim 1, wherein the measuring and compensating windings are connected in series with each other across said output and Nm=Nc.

3. A device as in claim 1, including a first resistance of value R1 connected to the amplifier output so that the measuring current flows through such resistance, and a second resistance of value R2 connected to the amplifier output so that the compensating current flows through such second resistance, wherein R1/R2=Nm/Nc.

4. A device as in claim 3, including means connected across a series connection of the amplifier output and the second resistance for causing the compensating current to be independent of the impedance of the compensating winding.

5. A device as in claim 4, wherein said means comprise
   (i) a series connection of a pair of third resistances of values having a predetermined ratio to each other,
   (ii) a second amplifier having an input and an output,
   (iii) the input of the second amplifier being connected between a center point of said series connection of resistances and a junction point between the compensating winding and the second resistance,
   (iv) the output of the second amplifier being connected across said series connection of resistances, and
   (v) a fourth resistance having a value relative to that of the second resistance equal to said predetermined ratio, said fourth resistance being connected between the output of the second amplifier and said junction point.

6. A device as in claim 1, including means for observing the waveform of at least one of the measuring and compensating currents.

7. A device as in claim 1, including means for observing the presence of even harmonics in at least one of the measuring and compensating currents.

8. A device as in claim 7, wherein said observing means comprise a peak detector connected in series with one of the measuring and compensating windings.

9. A device as in claim 7, including a D.C. feedback winding electromagnetically coupled with both the cores, and a D.C. amplifier having an input and an output, said input of the D.C. amplifier being connected to said observing means for detecting even harmonics, and said output of the D.C. amplifier being connected across a D.C. feedback circuit comprising a current measuring device in series with said D.C. feedback winding.

10. A current transformer comprising a device as in claim 1, and primary and secondary windings electromagnetically coupled with the cores of said device.

11. A current transformer comprising a device as in claim 2, and primary and secondary windings electromagnetically coupled with the cores of said device.

12. A current transformer comprising a device as in claim 3, and primary and secondary windings electromagnetically coupled with the cores of said device.

13. A current transformer comprising a device as in claim 4, and primary and secondary windings electromagnetically coupled with the cores of said device.

14. A current transformer comprising a device as in claim 5, and primary and secondary windings electromagnetically coupled with the cores of said device.

15. A current transformer comprising a device as in claim 6, and primary and secondary windings electromagnetically coupled with the cores of said device.

16. A current transformer comprising a device as in claim 7, and primary and secondary windings electromagnetically coupled with the cores of said device.

17. A current transformer comprising a device as in claim 8, and primary and secondary windings electromagnetically coupled with the cores of said device.

18. A current transformer comprising a device as in claim 9, and primary and secondary windings electromagnetically coupled with the cores of said device.

19. A current transformer comprising:
   (a) a first magnetic core,
   (b) a second magnetic core,
   (c) a measuring winding electromagnetically coupled with the first core but not the second core,
   (d) a primary winding electromagnetically coupled with both cores,
   (e) a secondary winding electromagnetically coupled with both cores to provide a secondary current Is when connected to a burden,
   (f) an amplifier having an input and an output,
   (g) said input being connected to receive the waveform across the measuring winding,
   (h) said output being connected to provide a current in the measuring winding equal to a magnetizing current I$\mu$ required to magnetize the second core,
   (i) the measuring and secondary windings being connected in parallel across the burden, and (j) means for observing the waveform of the current in the measuring winding.

20. A current transformer as in claim 19, wherein said observing means includes means for observing the presence of even harmonics in the current in the measuring winding.

21. A current transformer as in claim 20, including a D.C. feedback winding electromagnetically coupled with both the cores, said D.C. feedback winding being connected in parallel with the secondary winding across the burden, and a D.C. amplifier having an input and an output, said input of the D.C. amplifier being connected to said observing means for detecting even harmonics, and said output of the D.C. amplifier being connected to provide a D.C. current in said D.C. feedback winding whereby the current in the burden is a replica of both the A.C. and D.C. components of the current in the primary winding.

* * * * *